United States Patent
Bouche et al.

(10) Patent No.: US 9,425,097 B1
(45) Date of Patent: Aug. 23, 2016

(54) CUT FIRST ALTERNATIVE FOR 2D SELF-ALIGNED VIA

(71) Applicant: GLOBALFOUNDRIES Inc., Grand Cayman (KY)

(72) Inventors: Guillaume Bouche, Albany, NY (US); Andy Wei, Queensbury, NY (US); Sudharshanan Raghunathan, Mechanicville, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/699,154

(22) Filed: Apr. 29, 2015

(51) Int. Cl.
*H01L 23/48* (2006.01)
*H01L 21/768* (2006.01)
*H01L 23/522* (2006.01)
*H01L 23/528* (2006.01)
*H01L 23/532* (2006.01)

(52) U.S. Cl.
CPC ... *H01L 21/76897* (2013.01); *H01L 21/76816* (2013.01); *H01L 21/76819* (2013.01); *H01L 21/76829* (2013.01); *H01L 23/528* (2013.01); *H01L 23/5226* (2013.01); *H01L 23/5329* (2013.01); *H01L 23/53238* (2013.01); *H01L 2221/1094* (2013.01)

(58) Field of Classification Search
CPC ............ H01L 21/76897; H01L 21/76816; H01L 21/76819; H01L 21/76829; H01L 23/5226; H01L 23/528; H01L 23/53238; H01L 23/5329; H01L 2221/1094

USPC ............ 257/774, 347, 368; 438/586
See application file for complete search history.

(56) References Cited

U.S. PATENT DOCUMENTS

| | | | | |
|---|---|---|---|---|
| 8,791,010 | B1 * | 7/2014 | Herner | H01L 45/04 438/618 |
| 8,901,630 | B2 * | 12/2014 | Huh | H01L 29/7827 257/296 |
| 9,177,797 | B2 * | 11/2015 | Chang | H01L 21/0338 |
| 2013/0154004 | A1 * | 6/2013 | Liu | H01L 29/66795 257/347 |
| 2014/0077305 | A1 * | 3/2014 | Pethe | H01L 21/76895 257/368 |
| 2015/0236106 | A1 | 8/2015 | Zaleski et al. | |
| 2015/0263131 | A1 * | 9/2015 | Metz | H01L 29/495 438/586 |
| 2015/0311082 | A1 | 10/2015 | Bouche et al. | |
| 2016/0064514 | A1 | 3/2016 | Bouche et al. | |

* cited by examiner

*Primary Examiner* — Mohammed Shamsuzzaman
(74) *Attorney, Agent, or Firm* — Ditthavong & Steiner, P.C.

(57) ABSTRACT

A method of lithographically cutting a Mx line before the Mx line is lithographically defined by patterning and the resulting 2DSAV device are provided. Embodiments include forming an a-Si dummy metal layer over a $SiO_2$ layer; forming a first softmask stack over the a-Si dummy metal layer; patterning a plurality of vias through the first softmask stack down to the $SiO_2$ layer; removing the first soft mask stack; forming first and second etch stop layers over the a-Si dummy metal layer, the first etch stop layer formed in the plurality of vias; forming a-Si mandrels on the second etch stop layer; forming oxide spacers on opposite sides of each a-Si mandrel; removing the a-Si mandrels; forming a-Si dummy metal lines in the a-Si dummy metal layer below the oxide spacers; and forming a SiOC layer between the a-Si dummy metal lines.

10 Claims, 6 Drawing Sheets

CUT FIRST ALTERNATIVE FOR 2D SELF-ALIGNED VIA

TECHNICAL FIELD

The present disclosure relates to the manufacture of semiconductor devices with vias or interconnects. The present disclosure is particularly applicable to the 10 nanometer (nm) technology node and beyond.

BACKGROUND

To provide electrical conductivity between layers in a semiconductor device, a via or interconnect may be formed through an interlayer dielectric (ILD). The via is then lined with a barrier and filled with an electrically conductive material such as copper (Cu) to provide electrical conductivity between two or more metal layers, e.g., Mx and Mx+1.

A known approach for forming two-dimensional (2D) self-aligned vias (2DSAV) involves forming dummy Mx lines, e.g., formed of amorphous silicon (a-Si) and a silicon nitride (SiN) cap; patterning cuts or vias in the dummy Mx lines; forming a layer of silicon oxycarbide (SiOC) layer over the SiN cap and in the cuts; polishing back the SiOC fill to uncover the top of the dummy Mx lines; removing the Mx dummy lines, and Mx metallization. However, the polishing back of the SiOC layer increases overall production costs and time.

A need therefore exists for methodology enabling a less expensive 2DSAV formation process, and the resulting device.

SUMMARY

An aspect of the present disclosure is a method of cutting a Mx line before the Mx line is defined by patterning.

Another aspect of the present disclosure is a less expensive 2DSAV device.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming an amorphous silicon (a-Si) dummy metal layer over a silicon oxide ($SiO_2$) layer; forming a first softmask stack over the a-Si dummy metal layer; patterning a plurality of vias through the first softmask stack down to the $SiO_2$ layer; removing the first soft mask stack; forming first and second etch stop layers over the a-Si dummy metal layer, the first etch stop layer formed in the plurality of vias; forming a-Si mandrels on the second etch stop layer; forming oxide spacers on opposite sides of each a-Si mandrel; removing the a-Si mandrels; forming a-Si dummy metal lines in the a-Si dummy metal layer below the oxide spacers; and forming a silicon oxycarbide (SiOC) layer between the a-Si dummy metal lines.

Aspects of the present disclosure include forming each of the first softmask stack and a second softmask stack by: forming a spin-on-hardmask (SOH) layer over an a-Si layer; forming a silicon oxynitrdie (SiON) layer over the SOH layer; forming a buried anti-reflective coating (BARC) layer over the SiON layer; and forming a photoresist layer over the BARC layer. Other aspects include forming the a-Si mandrels by: patterning the photoresist layer of the second softmask stack down to the BARC layer, the patterning forming parallel lines; and etching between the parallel lines down to the second etch stop layer. Further aspects include patterning the plurality of vias by: forming a plurality of holes by lithography in the photoresist layer of the first soft mask stack down to the SiON layer; etching the plurality of holes through the SiON layer into a portion of the SOH layer; etching the plurality of holes through portion of the SOH layer down to the a-Si dummy metal layer; and etching the plurality of holes through the a-Si dummy metal layer down to the $SiO_2$ layer. Additional aspects include forming the first etch stop layer of SiOC and the second etch stop layer of silicon nitride (SiN). Another aspect includes forming the first and second etch stop layers in separate process steps. Other aspects include forming the oxide spacers by: forming an oxide layer over the a-Si mandrels; and etching the oxide layer. Further aspects include forming the a-Si dummy metal lines by: etching the second etch stop layer between the oxide spacers subsequent to removing the a-Si mandrels; etching the first etch stop layer between the oxide spacers; removing the oxide spacers; and etching the a-Si dummy metal layer down to the $SiO_2$ layer. Additional aspects include etching the a-Si dummy metal layer selective to oxide, the first etch stop layer in the plurality of vias interrupting the a-Si dummy metal lines. Another aspect includes forming the a-Si dummy metal lines using a single integrated etch process. Other aspects include planarizing the SiOC layer down to the second etch stop layer.

Another aspect of the present disclosure is a device including: a Si substrate; a $SiO_2$ layer formed over the Si substrate; a plurality of a-Si dummy metal lines formed over the $SiO_2$ layer, each a-Si dummy metal line having an upper surface and one or more of the a-Si dummy metal lines having a via; a first etch stop layer formed over the upper surface of the a-Si dummy metal lines and in the via; a second etch stop layer formed over the first etch stop layer; and a SiOC layer between the a-Si dummy metal lines.

Aspects of the device include the plurality of a-Si dummy metal lines being formed by self-aligned double patterning (SADP). Other aspects include the first etch stop layer being formed of SiOC and the second etch stop layer being formed of SiN. Further aspects include an a-Si dummy metal line including a via being interrupted by the first etch stop layer formed in the via.

A further aspect of the present disclosure is a method including: forming a first $SiO_2$ layer over a silicon substrate; forming an a-Si dummy metal layer over the first $SiO_2$ layer; forming a softmask stack over the a-Si dummy metal layer; patterning a metal line cut through the softmask stack down to the first $SiO_2$ layer; forming a first SiOC layer, the first SiOC layer filling the metal line cut; forming a first SiN layer on the first SiOC layer; forming an a-Si dummy mandrel layer on the first SiN layer; forming a second softmask stack over the a-Si dummy mandrel layer; patterning the second softmask stack down to the first SiN layer, the patterning forming a-Si mandrels; forming an oxide layer over the a-Si mandrels; etching the oxide layer, the etching forming oxide spacers on opposite sides of each of the a-Si mandrels; forming a-Si dummy metal lines in the a-Si dummy metal layer below the oxide spacers; forming a second SiOC, $SiO_2$, or SiN layer over the a-Si dummy metal lines; and planarizing the second SiOC, $SiO_2$, or SiN layer down to the SiN layer.

Aspects of the present disclosure include forming each of the first and second softmask stacks by: forming a SOH layer over an a-Si layer; forming a SiON layer over the SOH layer; forming a BARC layer over the SiON layer; and forming a photoresist layer over the BARC layer. Other aspects include patterning the metal line cut by: forming a cut by lithography in the photoresist layer of the first soft mask stack down to the SiOn layer; etching the cut through the SiON layer into a portion of the SOH layer; etching the cut through the portion of the SOH layer down to the a-Si dummy metal layer; and etching the cut through the a-Si dummy metal layer down to the first $SiO_2$ layer. Further aspects include forming the a-Si dummy metal lines by: etching the first SiN layer between the oxide spacers subsequent to removing the a-Si mandrels; etching the first SiOC layer between the oxide spacers; removing the oxide spacers; etching the a-Si dummy metal layer down to the first $SiO_2$ layer; and planarizing the second SiOC, $SiO_2$, or SiN layer down to the first SiN layer. Additional aspects include etching the a-Si dummy metal layer selective to oxide, the first SiOC layer in the plurality of vias interrupting the a-Si dummy metal lines.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of cost associated with forming a Mx line, cutting the Mx line, filling the cut, and polishing back the fill to uncover the top of the Mx line before Mx metallization attendant upon forming a 2DSAV device.

Methodology in accordance with embodiments of the present disclosure includes forming an a-Si dummy metal layer over a $SiO_2$ layer. A first softmask stack is formed over the a-Si dummy metal layer. A plurality of vias are patterned through the first softmask stack down to the $SiO_2$ layer. The first soft mask stack is removed and first and second etch stop layers are formed over the a-Si dummy metal layer, the first etch stop layer formed in the plurality of vias. A-Si mandrels are formed on the second etch stop layer and oxide spacers are formed on opposite sides of each a-Si mandrel. The a-Si mandrels are removed and a-Si dummy metal lines are formed in the a-Si dummy metal layer below the oxide spacers. A SiOC layer is formed between the a-Si dummy metal lines.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
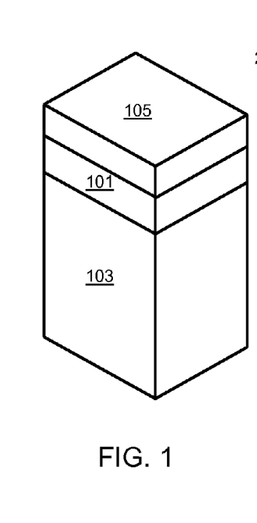
FIGS. 1 through 17 schematically illustrate a process flow for cutting a Mx line before the Mx line is defined by patterning, in accordance with an exemplary embodiment.
Figure 2:
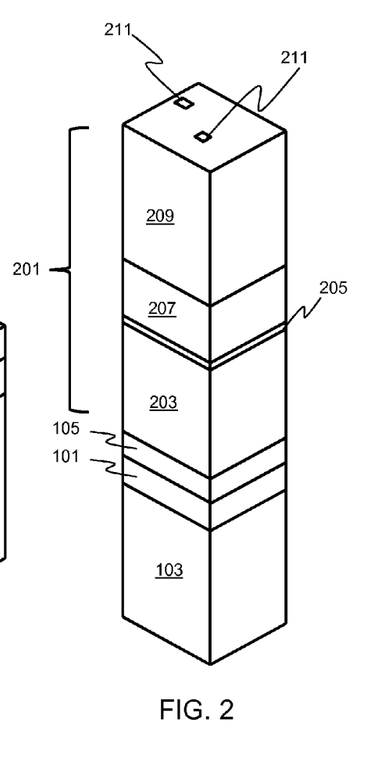
Figure 3:
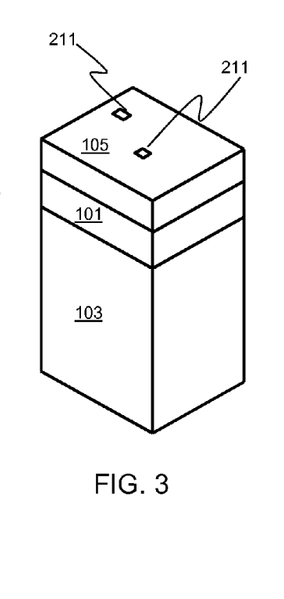

Adverting to FIG. 1 (FIG. 1 is an orthographic view of a Mx stack), a $SiO_2$ layer 101 is formed on a Si substrate 103. An a-Si dummy Mx layer 105 is then formed over the $SiO_2$ layer 101. Next, a softmask stack 201 is formed over the a-Si dummy Mx layer 105, as depicted in FIG. 2. The softmask stack 201 may be formed, for example, of a SiOH layer 203, a SiON layer 205, a BARC layer 207, and a photoresist layer 209. Vias 211 are then patterned or cut through the softmask stack 201 down to the $SiO_2$ layer 101, as depicted in FIG. 3. Consequently, the a-Si dummy Mx layer 105 and, therefore, future dummy Mx lines are cut before the Mx dummy lines have been defined by patterning.

Figure 4A:
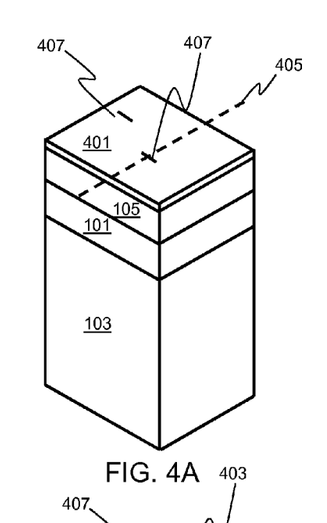
Figure 4B:
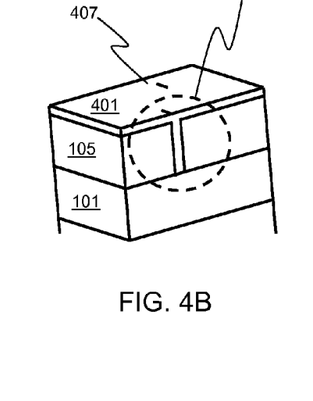

Adverting to FIG. 4A, once the soft mask stack 201 is removed, a SiOC layer 401 is formed over the a-Si dummy Mx layer 105, filling the vias 211 as depicted by the dashed circle 403 in FIG. 4B. (FIG. 4A is an orthographic view of the Mx stack and FIG. 4B is a cross-sectional view along the dashed line 405 of FIG. 4A). The SiOC layer 401 may be formed, for example, to a thickness of 8 nm to 15 nm, e.g., 12 nm. The lines 407 represent indentations in the surface of the SiOC layer 401 where the SiOC layer 401 filled the vias 211 of the a-Si dummy Mx layer 105.

Figures 5, 6:
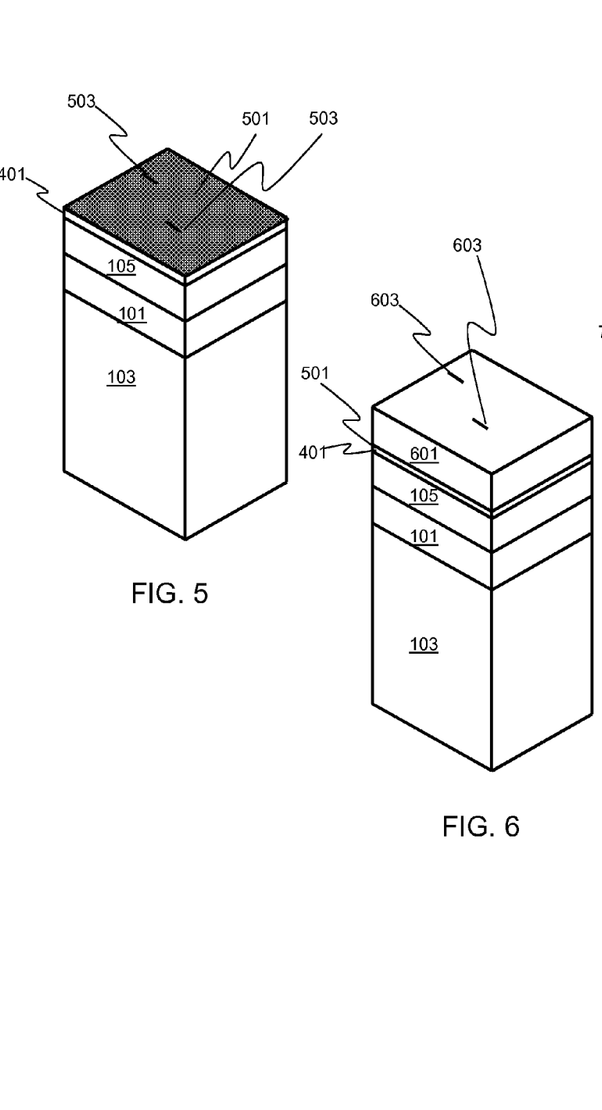

Adverting to FIG. 5, a SiN layer 501 is formed over the SiOC layer 401. Lines 503, like lines 407, represent indentations in the SiN layer 501 where the SiOC layer 401 filled the vias 211. The SiOC layer 401 and the SiN layer 501 may alternatively be formed, for example, in a single process step. Next, an a-Si layer 601 is formed over the SiN layer 501, as depicted in FIG. 6. Lines 603, like the lines 407 and 503, represent indentations in the a-Si layer 601 where the SiOC 401 layer filled the vias 211.

Figures 7, 8:
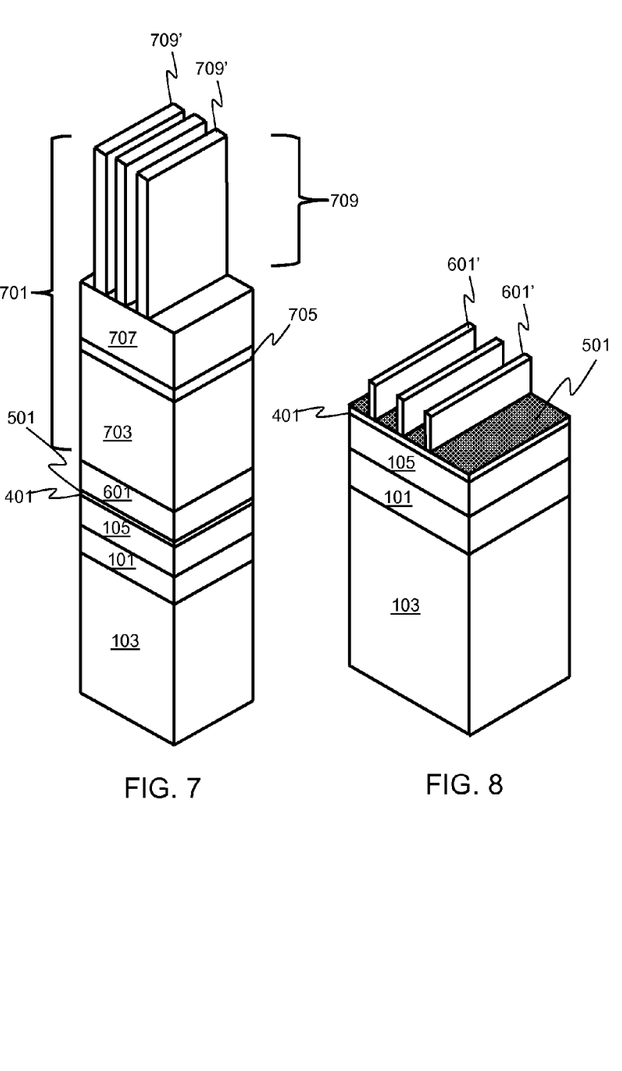
Figure 9:
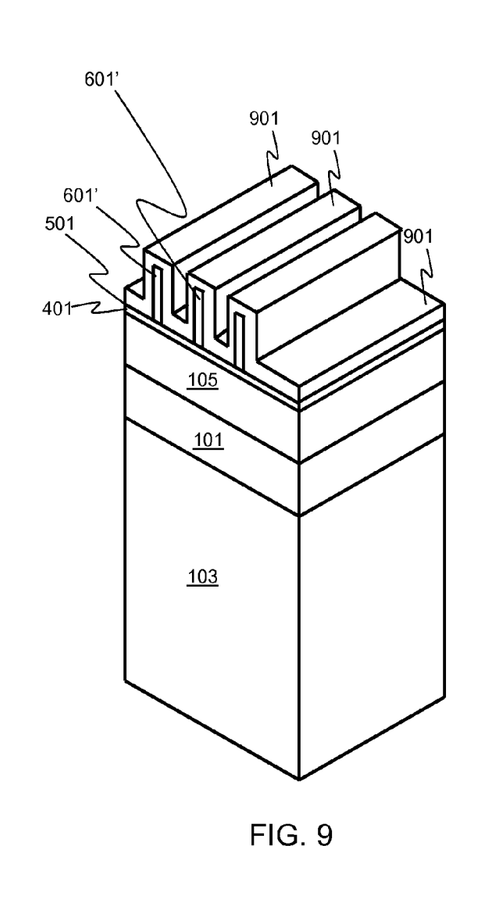
Figure 10:
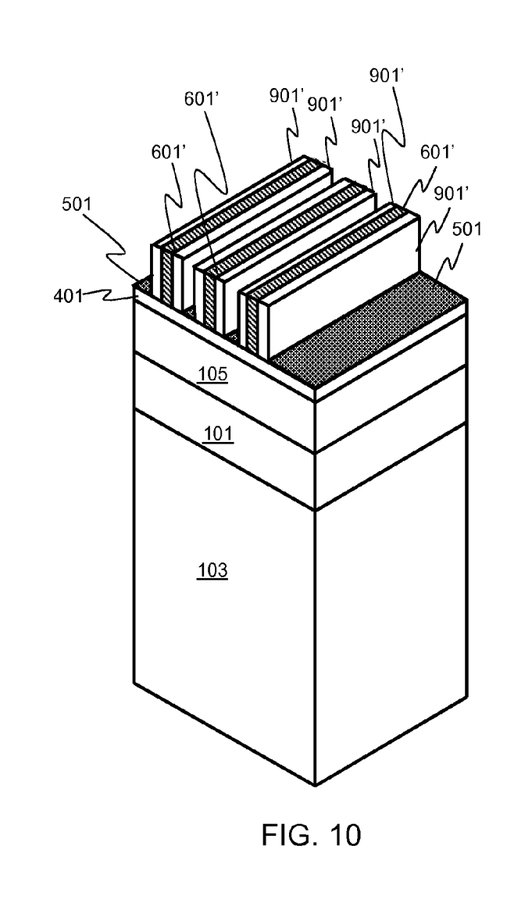

A softmask stack 701 is then formed over the a-Si layer 601, as depicted in FIG. 7. Similar to the softmask stack 201, the softmask stack 701 may be formed, for example, of a SiOH layer 703, a SiON layer 705, a BARC layer 707, and a photoresist layer 709. Once the softmask stack 701 is formed, the photoresist layer 709 may be patterned down the BARC layer 707, the patterning forming parallel lines 709'. Thereafter, a-Si mandrels 601' are formed by etching between the parallel lines 709' down to the SiN layer 501, as depicted in FIG. 8. Adverting to FIG. 9, once the softmask stack 701 is removed, an oxide layer 901 is formed over the a-Si mandrels 601'. The oxide layer 901 is then anisotropically etched down to the a-Si mandrels 601' and the SiN layer 501, respectively, to form spacers 901' on opposite sides of each a-Si mandrel 601', as depicted in FIG. 10. The oxide spacers 901' may then be used to form the future a-Si dummy Mx lines by spacer image transfer (SIT) for SADP.

Figure 11:
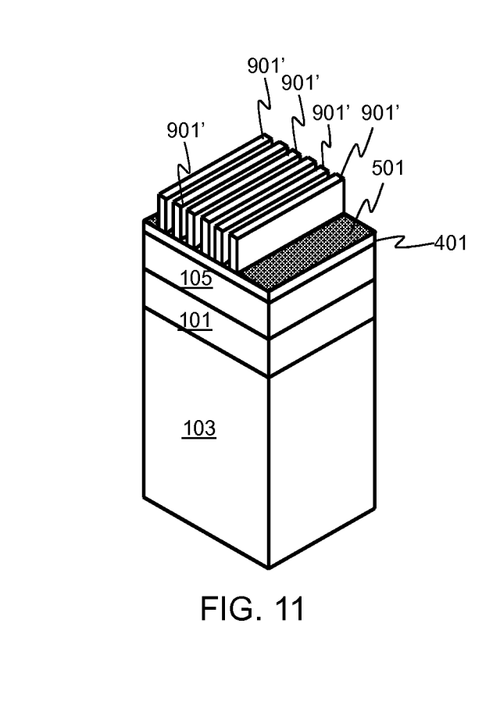
Figure 12:
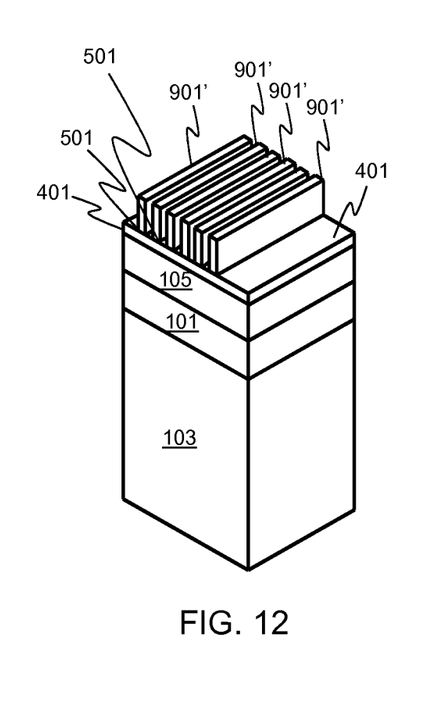
Figure 13:
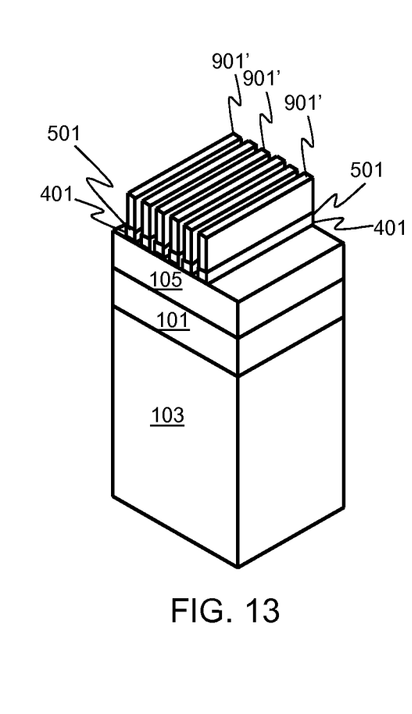
Figure 14:
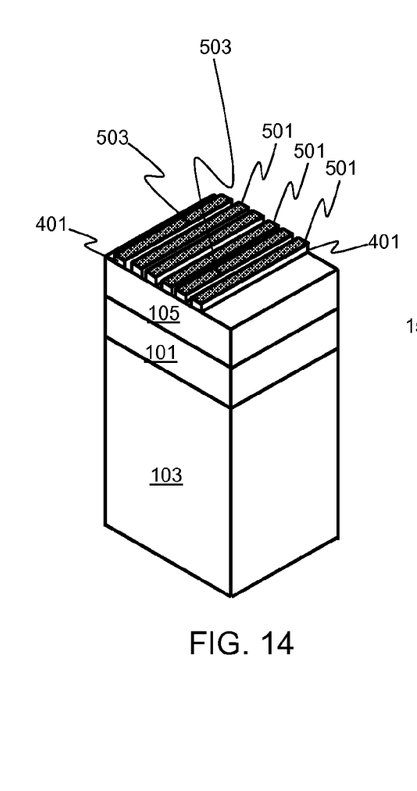
Figure 15A:
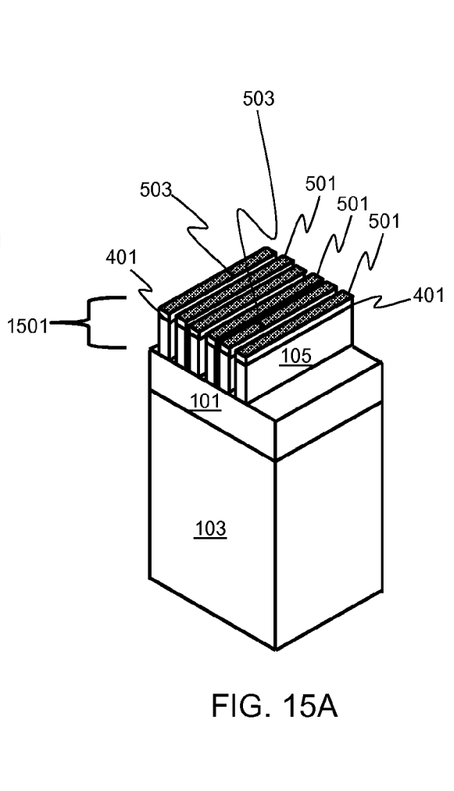
Figure 15B:
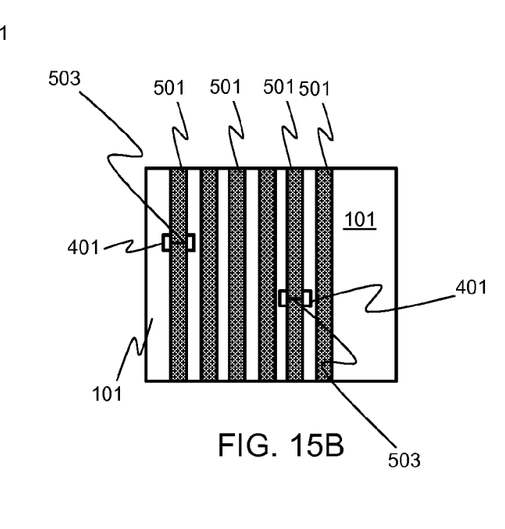

Adverting to FIG. 11, the future a-Si dummy Mx lines may be formed, for example, by first removing or pullingout the a-Si mandrels 601'. Adverting to FIG. 12, the SiN layer 501 is etched down to the SiOC layer 401 so that the SiN layer 501 only remains under the spacers 901'. Next, the SiOC layer 401 is etched, e.g., by a punch etch, down to the $SiO_2$ layer 105, as depicted in FIG. 13. Consequently, the SiOC layer 401, like the SiN layer 501, only remains under the spacers 901'. Adverting to FIG. 14, the spacers 901' are removed, e.g., by etching. The SiN layer 501 acts as an etch stop layer. The resulting a-Si dummy Mx lines 1501 are then formed, e.g., by a-Si etching the a-Si layer 105 down to the $SiO_2$ layer 101, with the SiN layer 501 acting as a hardmask, as depicted in FIG. 15A. (FIG. 15A is an orthographic view of the Mx stack, and FIG. 15B is an overhead view of FIG. 15A). In particular, the a-Si layer 105 is etched selective to oxide. Consequently, the SiOC layer 401 formed in the vias 211 of the a-Si dummy Mx layer 105 (under the indentation lines 503) interrupts the respective a-Si dummy Mx lines 1501, as depicted in FIG. 15B. Alternatively, the Mx line etch steps of FIGS. 11 through 15B may be combined into a single integrated etching process and/or performed in a single etch chamber.

Figure 16:
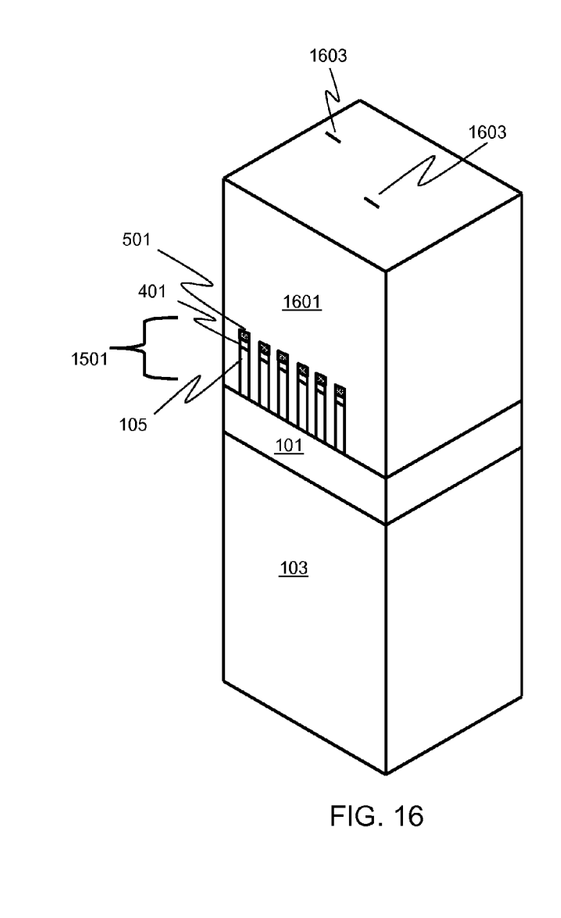
Figure 17:
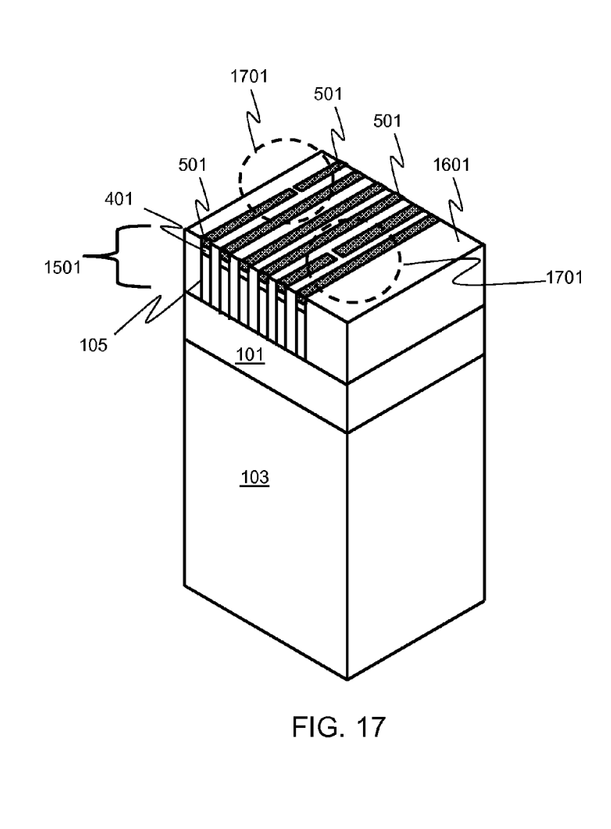

Adverting to FIG. 16, a SiOC layer 1601 may be formed, for example, over and between the a-Si dummy Mx lines 1501. The SiOC layer 1601 may also be formed, for example, of $SiO_2$ or SiN; however, SiOC has a lower K value than either $SiO_2$ or SiN. Therefore, the resulting device should have a lower capacitance if SiOC is used to fill between the a-Si dummy Mx lines 1501 rather than $SiO_2$ or SiN. Lines 1603 represent indentations in the SiOC layer 1601 above where the SiOC layer 401 filled the vias 211. The SiOC layer 1601 is then planarized, e.g., by CMP, down to the SiN layer 501, as depicted in FIG. 17. The dashed circles 1701 illustrate where the SiOC layer 401 interrupts the respective a-Si dummy Mx lines 1501. Consequently, in contrast to the formation steps of the known approach, by cutting the future Mx lines in the a-Si dummy Mx layer 105 before the Mx lines are defined by patterning, the SiOC layer 401 formed over the a-Si dummy Mx layer 105 and filled in the vias 211 no longer needs to be polished back to uncover the top of the Mx dummy lines since the Mx dummy lines have yet to be formed. Rather, the SiOC layer 401 is now used as a hardmask for forming the subsequent Mx dummy lines and, therefore, saving at least one etching step of the overall process.

The embodiments of the present disclosure can achieve several technical effects including reducing costs by avoiding at least one etch step and possibly a deposition and an etch step. In addition, the present disclosure may have alignment advantages since the Mx line is aligned with the Mx cut. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of highly integrated semiconductor devices in the 10 nm technology node and beyond.

In the preceding description, the present disclosure is described with reference to specifically exemplary embodiments thereof. It will, however, be evident that various modifications and changes may be made thereto without departing from the broader spirit and scope of the present disclosure. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   forming an amorphous silicon (a-Si) dummy metal layer over a silicon oxide (SiO2) layer;
   forming a first softmask stack over the a-Si dummy metal layer;
   patterning a plurality of vias through the first softmask stack down to the SiO2 layer;
   removing the first soft mask stack;
   forming first and second etch stop layers over the a-Si dummy metal layer, the first etch stop layer formed in the plurality of vias;
   forming a-Si mandrels on the second etch stop layer;
   forming oxide spacers on opposite sides of each of the a-Si mandrels;
   removing the a-Si mandrels;
   forming a-Si dummy metal lines in the a-Si dummy metal layer below the oxide spacers;
   forming a silicon oxycarbide (SiOC) layer between the a-Si dummy metal lines; and
   forming the a-Si dummy metal lines by:
   etching the second etch stop layer between the oxide spacers subsequent to removing the a-Si mandrels;
   etching the first etch stop layer between the oxide spacers;
   removing the oxide spacers; and etching the a-Si dummy metal layer down to the $SiO_2$ layer.

2. The method according to claim 1, further comprising forming each of the first softmask stack and a second softmask stack by:
   forming a spin-on-hardmask (SOH) layer over an a-Si layer;
   forming a silicon oxynitrdie (SiON) layer over the SOH layer;
   forming a buried anti-reflective coating (BARC) layer over the SiON layer; and
   forming a photoresist layer over the BARC layer.

3. The method according to claim 2, comprising forming the a-Si mandrels by:
   patterning the photoresist layer of the second softmask stack down to the BARC layer, the patterning forming parallel lines; and
   etching between the parallel lines down to the second etch stop layer.

4. The method according to claim 1, comprising patterning the plurality of vias by:
   forming a plurality of holes by lithography in the photoresist layer of the first soft mask stack down to the SiON layer;
   etching the plurality of holes through the SiON layer into a portion of the SOH layer;
   etching the plurality of holes through portion of the SOH layer down to the a-Si dummy metal layer; and
   etching the plurality of holes through the a-Si dummy metal layer down to the $SiO_2$ layer.

5. The method according to claim 1, comprising forming the first etch stop layer of SiOC and the second etch stop layer of silicon nitride (SiN).

6. The method according to claim 1, further comprising forming the first and second etch stop layers in separate process steps.

7. The method according to claim 1, comprising forming the oxide spacers by:
   forming an oxide layer over the a-Si mandrels; and
   etching the oxide layer.

8. The method according to claim 1, comprising etching the a-Si dummy metal layer selective to oxide, the first etch stop layer in the plurality of vias interrupting the a-Si dummy metal lines.

9. The method according to claim 1, comprising forming the a-Si dummy metal lines using a single integrated etch process.

10. The method according to claim 1, comprising planarizing the SiOC layer down to the second etch stop layer.

* * * * *